United States Patent
Lee et al.

(10) Patent No.: US 7,326,584 B2
(45) Date of Patent: Feb. 5, 2008

(54) METHOD OF MANUFACTURING LIGHT EMITTING ELEMENT AND METHOD OF MANUFACTURING DISPLAY APPARATUS HAVING THE SAME

(75) Inventors: Dong-Won Lee, Seongnam-si (KR); Joon-Hoo Choi, Seoul (KR); Jin-Koo Chung, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 340 days.

(21) Appl. No.: 11/017,532

(22) Filed: Dec. 20, 2004

(65) Prior Publication Data

US 2005/0142975 A1    Jun. 30, 2005

(30) Foreign Application Priority Data

Dec. 19, 2003    (KR) .................. 10-2003-0093741

(51) Int. Cl.
*H01L 51/40*    (2006.01)
(52) U.S. Cl. .................. 438/29; 257/E51.003; 438/99
(58) Field of Classification Search .................. 438/22, 438/29, 99, 149; 445/24
See application file for complete search history.

(56) References Cited

U.S. PATENT DOCUMENTS

| | | | |
|---|---|---|---|
| 6,825,061 B2* | 11/2004 | Hokari et al. .................. 438/99 |
| 7,198,814 B2* | 4/2007 | Endo et al. .................... 427/66 |
| 2004/0041753 A1* | 3/2004 | Nakanishi ..................... 345/76 |
| 2006/0170339 A1* | 8/2006 | Kanno et al. ............... 313/506 |

* cited by examiner

*Primary Examiner*—Savitri Mulpuri
(74) *Attorney, Agent, or Firm*—F. Chau & Associates, LLC

(57) ABSTRACT

In a method of manufacturing a light emitting element, a plurality of first electrodes arranged in a matrix shape is formed on a pixel area of a base substrate. A bank is formed between the first electrodes. A light emitting material is ejected on a portion of the first electrodes spaced apart from one another to form a plurality of first light emitting patterns. The light emitting material is erected on a portion of the first electrodes between the first light emitting patterns to form a plurality of second light emitting patterns. A second electrode is formed on the first and second light emitting patterns. Therefore, a luminance of the light emitting element is improved and uniformized.

13 Claims, 13 Drawing Sheets

FIG. 1
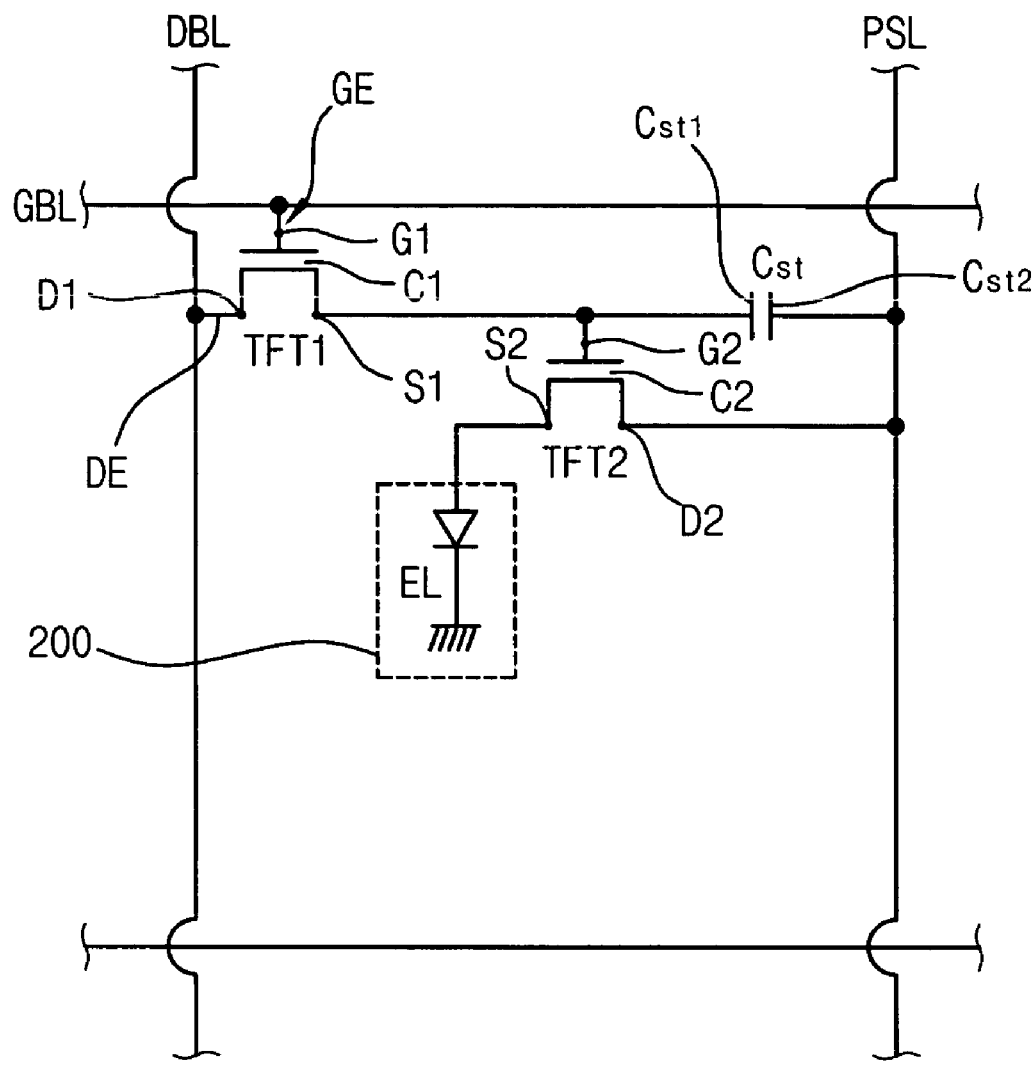
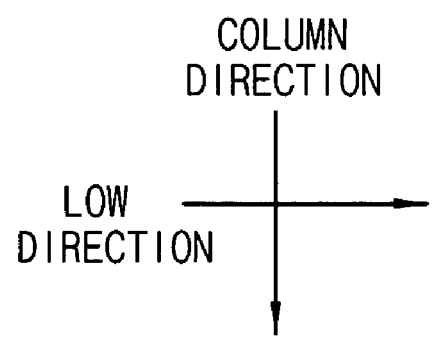

METHOD OF MANUFACTURING LIGHT EMITTING ELEMENT AND METHOD OF MANUFACTURING DISPLAY APPARATUS HAVING THE SAME

CROSS-REFERENCE OF RELATED APPLICATIONS

The present application claims priority from Korean Patent Application No. 2003-93741, filed on Dec. 19, 2003, the disclosure of which is hereby incorporated herein by reference in its entirety.

BACKGROUND OF THE INVENTION

1. Field of the Invention

The present invention relates to a method of manufacturing a light emitting element and a method of manufacturing a display apparatus having the light emitting element. More particularly, the present invention relates to a light emitting element capable of improving luminance and uniformity of the luminance and a method of manufacturing a display apparatus having the light emitting element.

2. Description of the Related Art

A display apparatus, in general, converts data processed by an information processing device into an image.

Display apparatuses includes a cathode ray tube (CRT) apparatus, a liquid crystal display (LCD) apparatus, an organic light emitting display (OLED) apparatus, a plasma display panel (PDP) apparatus, etc. The CRT apparatus controls electrons that are irradiated onto a fluorescent layer to display an image. The LCD apparatus displays the image using a liquid crystal. The OLED apparatus has a light emitting layer that generates a light using a current. The PDP apparatus displays the image using plasma.

The OLED apparatus has various characteristics such as a thin thickness, a high luminance, a good color reproducibility, etc.

The OLED apparatus has a faster response speed, a better color reproducibility, lower power consumption and a lower manufacturing cost than the LCD apparatus. In addition, the OLED apparatus may be operated at a lower temperature than the LCD apparatus.

The OLED apparatus has a plurality of anodes arranged in a matrix shape on a substrate, an organic layer having cavities, light emitting patterns formed on the anodes in the cavities and a cathode on the light emitting patterns.

Each of the light emitting patterns may have a positive charge carrier injecting pattern, a light emitting pattern, etc. The light emitting pattern may further have a negative charge carrier injecting pattern.

The light emitting pattern may be formed through a spin coating process, a roll-to-roll process, a vacuum deposition process, etc. The light emitting pattern may be formed using a slit mask. In addition, droplets having a light emitting material are ejected in the cavities to form the light emitting pattern through an inkjet method.

In a conventional inkjet method, the droplets are ejected through nozzles in the cavities. An inkjet printer may use the inkjet method.

All of the droplets may not be simultaneously ejected in all of the cavities so that the inkjet method has a scanning process. In the scanning process, a portion of the droplets is serially ejected in a portion of the cavities.

When the droplets are ejected in the cavities using the scanning process, evaporation rates of the droplets ejected in the cavities are different from one another so that the light emitting patterns have different profiles from one another.

When the profiles of the light emitting patterns are different from one another, the OLED apparatus has non-uniform luminance so that an image display quality of the OLED apparatus is deteriorated.

SUMMARY OF THE INVENTION

The present invention provides a light emitting element capable of improving luminance and uniformity of the luminance.

The present invention also provides a method of manufacturing a display apparatus having the above-mentioned light emitting element.

A method of manufacturing a light emitting element in accordance with an aspect of the present invention is provided as follows. A plurality of first electrodes arranged in a matrix shape is formed on a pixel area of a base substrate. A bank is formed between the first electrodes. A light emitting material is ejected on a portion of the first electrodes spaced apart from one another to form a plurality of first light emitting patterns. The light emitting material is ejected on a portion of the first electrodes between the first light emitting patterns to form a plurality of second light emitting patterns. A second electrode is formed on the first and second light emitting patterns.

A method of manufacturing a light emitting element in accordance with another aspect of the present invention is provided as follows. A plurality of first electrodes arranged in a matrix shape is formed on a pixel area of a base substrate. A bank is formed between the first electrodes. A light emitting material is ejected on a portion of the first electrodes spaced apart from one another to form a plurality of first light emitting patterns. The light emitting material is ejected on a portion of the first electrodes between the first light emitting patterns to form a plurality of second light emitting patterns. The light emitting material is ejected on a portion of the first electrodes between the first and second light emitting patterns to form a plurality of third light emitting patterns. A second electrode is formed on the first to third light emitting patterns.

A method of manufacturing a display apparatus in accordance with an aspect of the present invention is provided as follows. A plurality of switching devices is formed on a pixel area of a base substrate. A plurality of driver devices is formed on the pixel area of the base substrate. A gate electrode of the driver device is electrically connected to a source/drain electrode of the switching device. A plurality of first electrodes arranged in a matrix shape is formed on the pixel area of the base substrate. A bank is formed between the first electrodes. A light emitting material is ejected on a portion of the first electrodes spaced apart from one another to form a plurality of first light emitting patterns. The light emitting material is ejected on a portion of the first electrodes between the first light emitting patterns to form a plurality of second light emitting patterns. A second electrode is formed on the first and second light emitting patterns.

The light emitting material may also be dropped or discharged on the first electrodes.

Therefore, ejecting order of the light emitting material is controlled so that evaporation rate of volatile material in the light emitting material is not affected by adjacent light emitting patterns. Therefore, thicknesses of the light emitting patterns are uniformized so that luminance of the display apparatus is improved and uniformized.

BRIEF DESCRIPTION OF THE DRAWINGS

The above and other advantages of the present invention will become more apparent by describing in detail exemplary embodiments thereof with reference to the accompanying drawings, in which:

FIG. 1 is a circuit diagram showing a display apparatus in accordance with an exemplary embodiment of the present invention;

DESCRIPTION OF THE EXEMPLARY EMBODIMENTS

It should be understood that the exemplary embodiments of the present invention described below may be varied modified in many different ways without departing from the inventive principles disclosed herein, and the scope of the present invention is therefore not limited to these particular following embodiments. Rather, these embodiments are provided so that this disclosure will be through and complete, and will fully convey the concept of the invention to those skilled in the art by way of example and not of limitation.

Hereinafter, the present invention will be described in detail with reference to the accompanying drawings.

FIG. 1 is a circuit diagram showing a display apparatus in accordance with an exemplary embodiment of the present invention.

Figure 3:
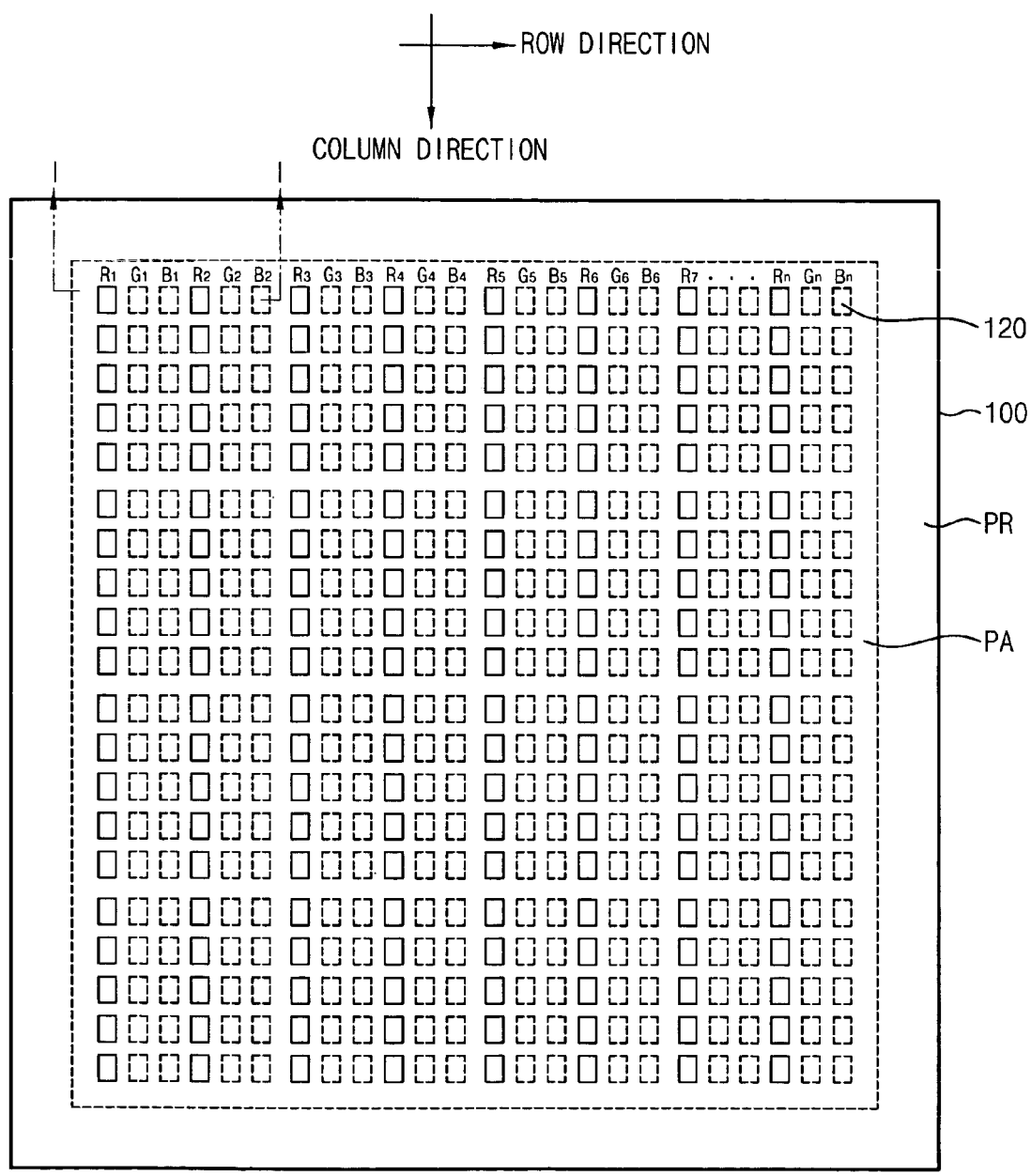
FIG. 3 is a plan view showing first electrodes formed on a base substrate in accordance with an exemplary embodiment of the present invention.

Referring to FIG. 1, the display apparatus includes a base substrate 100 of FIG. 3 and a display circuit. The display circuit has a switching device TFT1, a driver device TFT2, a light emitting element 200, a storage capacitor $C_{st}$, a gate bus line GBL, a data bus line DBL and a power supplying line PSL. Alternatively, the display circuit may have a plurality of switching devices, a plurality of driver devices, a plurality of light emitting elements, a plurality of storage capacitors, a plurality of gate bus lines, a plurality of data bus lines and a plurality of power supplying lines.

The gate bus line GBL is extended along a row direction. The gate bus line GBL includes a metal having a low electric resistance such as aluminum (Al), aluminum alloy, chromium (Cr), chromium alloy, molybdenum (Mo), molybdenum alloy, titanium (Ti), titanium alloy, tantalum (Ta), tantalum alloy, silver (Ag), silver alloy, copper (Cu), copper alloy, etc. The gate bus line GBL includes a gate electrode portion GE. The gate electrode portion GE is protruded from the gate bus line GBL in the column direction.

The data bus line DBL is extended in the column direction. The data bus line DBL includes a metal having a low resistance such as aluminum (Al), aluminum alloy, chromium (Cr), chromium alloy, molybdenum (Mo), molybdenum alloy, titanium (Ti), titanium alloy, tantalum (Ta), tantalum alloy, silver (Ag), silver alloy, copper (Cu), copper alloy, etc. The data bus line DBL includes a drain electrode portion DE. The drain electrode portion DE is protruded from the data bus line DBL in the row direction.

The power supplying line PSL is extended in the column direction such that the power supplying line PSL is spaced apart from the data bus line DBL. A voltage Vdd is applied to the power supplying line PSL.

The switching device TFT1 and the driver device TFT2 are disposed in a pixel region defined by the gate bus line GBL, the data bus line DBL and the power supply line PSL.

The switching device TFT1 includes a first gate electrode G1, a first semiconductor pattern C1, a first source electrode S1 and a first drain electrode D1.

The first gate electrode G1 is electrically connected to the gate electrode portion GE protruded from the gate bus line GBL.

The first semiconductor pattern C1 is disposed over the first gate electrode such that the first semiconductor pattern C1 is electrically insulated from the first gate electrode G1. That is, a gate insulation layer (not shown) including a dielectric material is interposed between the semiconductor pattern C1 and the first gate electrode G1.

The first drain electrode D1 formed on the first semiconductor pattern C1 is electrically connected to the drain electrode portion DE protruded from the data bus line DBL.

The first source electrode S1 is spaced apart from the first drain electrode D1 and electrically connected to the first semiconductor pattern C1.

The driver device TFT2 is also disposed in the pixel region. The driver device TFT2 includes a second gate electrode G2, a second semiconductor pattern C2, a second drain electrode D2 and a second source electrode S2.

The second gate electrode G2 is electrically connected to the first source electrode S1 of the switching device TFT1.

The second semiconductor pattern C2 is disposed over the second gate electrode G2 such that the second semiconductor pattern C2 is electrically insulated from the second gate electrode G2. That is, the gate insulation layer (not shown) is interposed between the second gate electrode G2 and the second semiconductor pattern C2.

The second drain electrode D2 formed on the second semiconductor pattern C2 is electrically connected to the power supplying line PSL.

The second source electrode S2 formed on the second semiconductor pattern C2 is spaced apart from the second drain electrode D2 and electrically connected to the light-emitting unit 200.

The storage capacitor $C_{st}$ includes a first capacitor electrode $C_{st1}$, a second capacitor electrode $C_{st2}$ and a dielectric layer. The first capacitor electrode $C_{st1}$ is electrically connected to the second gate electrode G2. Alternatively, a portion of the second gate electrode G2 may function as the first capacitor electrode $C_{st1}$. The second capacitor electrode $C_{st2}$ is electrically connected to the power supplying line PSL. Alternatively, a portion of the power supplying line PSL may function as the second capacitor electrode $C_{st2}$. The dielectric layer is interposed between the first and second capacitor electrodes $C_{st1}$ and $C_{st2}$. The driver device TFT2 may be kept in a turned-on state during one frame period due to the storage capacitor $C_{st}$.

When an image signal and a turn-on voltage are applied to the data bus line DBL and the gate bus line GBL, respectively, the image signal is applied to the first source electrode S1 of the switching device TFT1 through the first drain electrode D1 and the first semiconductor pattern C1 of the switching device TFT1.

Then, the image signal outputted from the first source electrode S1 of the switching device TFT1 is applied to the second gate electrode G2 of the driver device TFT2 to turn on the driver device TFT2. A voltage level of the image signal determines a resistance of the second semiconductor pattern C2. When the driver device TFT2 is turned on, the voltage Vdd of the power supplying line PSL is applied to the second source electrode S2 of the driver device TFT2 through the second drain electrode D2 and the second semiconductor pattern C2. The voltage Vdd is ejected in accordance with the resistance of the second semiconductor pattern C2 to output a first driving signal corresponding to the voltage level of the image signal.

Figure 2:
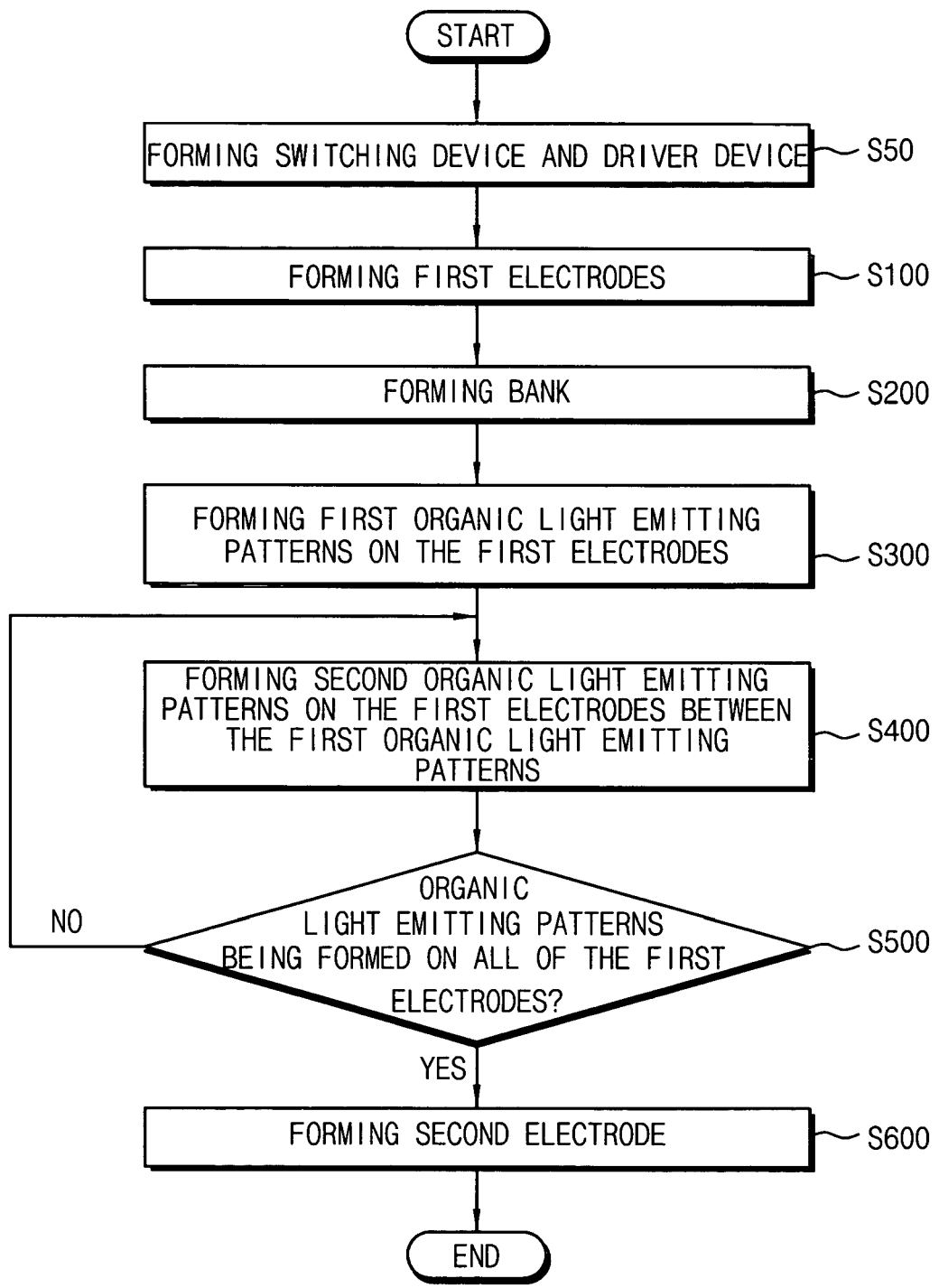
FIG. 2 is a flow chart showing a method of manufacturing a display apparatus in accordance with an exemplary embodiment of the present invention.
Figure 4:
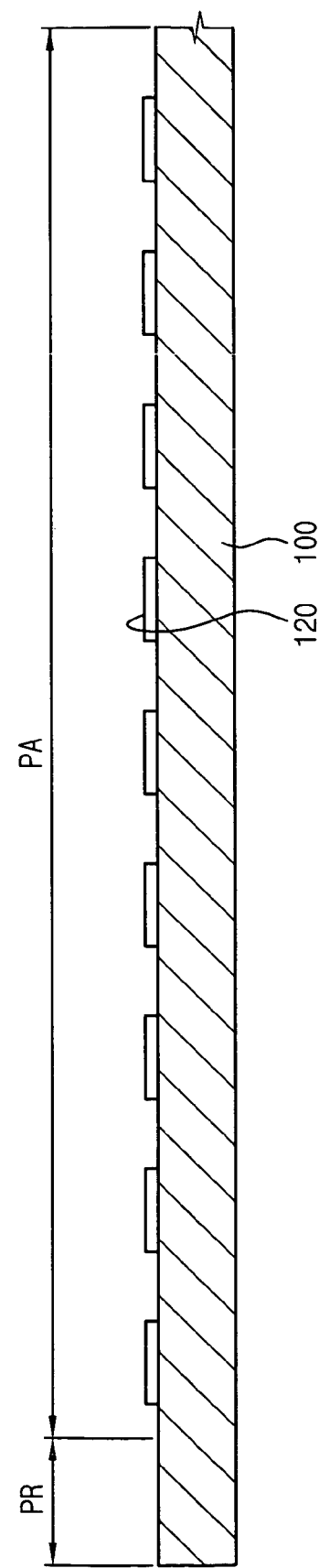
FIG. 4 is a cross-sectional view taken along a line I-I' of FIG. 3.

FIG. 2 is a flow chart showing a method of manufacturing a display apparatus in accordance with an exemplary embodiment of the present invention. FIG. 3 is a plan view showing first electrodes formed on a base substrate in accordance with an exemplary embodiment of the present invention. FIG. 4 is a cross-sectional view taken along a line I-I' of FIG. 3.

Referring to FIGS. 2 to 4, the switching device TFT1 of FIG. 1, the driver device TFT2 of FIG. 1, the data bus line DBL of FIG. 1, the gate bus line GBL of FIG. 1 and the power supply line PSL of FIG. 1 are formed on a pixel area PA of a base substrate 100 (step S50). First electrodes 120 are formed on the pixel area PA of a base substrate 100 having the switching device TFT1 of FIG. 1, the driver device TFT2 of FIG. 1, the data bus line DBL of FIG. 1, the gate bus line GBL of FIG. 1 and the power supply line PSL of FIG. 1 (step S100). A peripheral region PR surrounds the pixel area PA.

A transparent conductive material such as indium tin oxide (ITO), tin oxide (TO), indium zinc oxide (IZO), zinc oxide (ZO), etc., or a reflective material such as aluminum alloy, silver, silver alloy, etc., is deposited on the base substrate 100 through a sputtering method, a chemical vapor deposition (CVD), etc.

The deposited material is patterned through a photolithography process having an exposing process, a development process, an etching process, etc., to form the first electrodes 120.

The first electrodes 120 are arranged in a matrix shape in the pixel area PA. In this exemplary embodiment, the matrix shape of the first electrodes 120 has 3n columns and m rows, and the number of the first electrodes 120 is 3n×m. The first electrodes 120 correspond to red pixels, green pixels and blue pixels, respectively. The red pixels correspond to red light emitting patterns of R1, R2, . . . Rn columns. The green pixels correspond to green light emitting patterns of G1, G2, . . . Gn columns. The blue pixels correspond to blue light emitting patterns of B1, B2, . . . Bn columns. In this exemplary embodiment, the red light emitting patterns of R1, R2, . . . Rn columns have first light emitting patterns 141 of R1, R4, . . . Rn-2 columns, second light emitting patterns 142 of R2, R5, . . . Rn-1 columns and third light emitting patterns 142a of R3, R6, . . . Rn columns. The green light emitting patterns of G1, G2, . . . Gn columns may have first green light emitting patterns of G1, G4, . . . Gn-2 columns, second green light emitting patterns of G2, G5, . . . Gn-1 columns and third green light emitting patterns of G3, G6, . . . Gn columns. The blue light emitting patterns of B1, B2, . . . Bn columns may have first blue light emitting patterns of B1, B4, . . . Bn-2 columns, second blue light emitting patterns of B2, B5, . . . Bn-1 columns and third blue light emitting patterns of B3, B6, . . . Bn columns.

Figure 5:
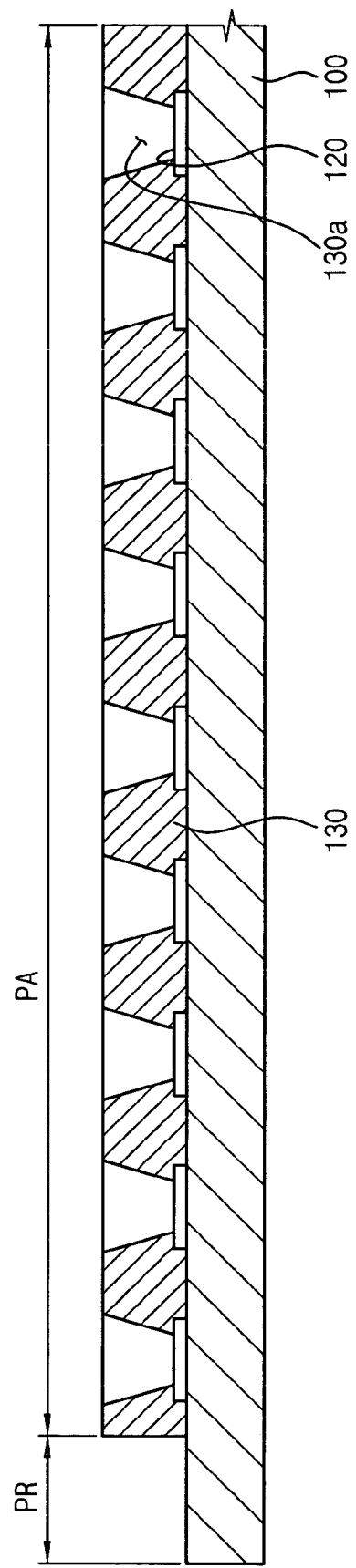
FIG. 5 is a cross-sectional view showing a bank formed between the first electrodes of FIG. 3.

FIG. 5 is a cross-sectional view showing a bank formed between the first electrodes of FIG. 3.

Referring to FIGS. 2 and 5, a bank 130 is formed on the base substrate 100 on which the first electrodes 120 are formed (step S200).

An organic layer (not shown) is formed on the base substrate 100 through a spin coating method or a slit coating method. In this exemplary the organic layer (not shown) has photoresist. When the organic layer (not shown) has the photoresist, the bank 130 is formed through the photo process. Alternatively, the organic layer (not shown) may not have the photoresist. When the organic layer (not shown) does not have the photoresist, the bank 130 is formed through the photolithography process that includes the etching process.

The organic layer (not shown) is patterned as the matrix shape to form cavities 130a on the first electrodes 120. The bank 130 is disposed between the first electrodes 120 so that the first electrodes 120 are electrically insulated from each another.

Figure 6:
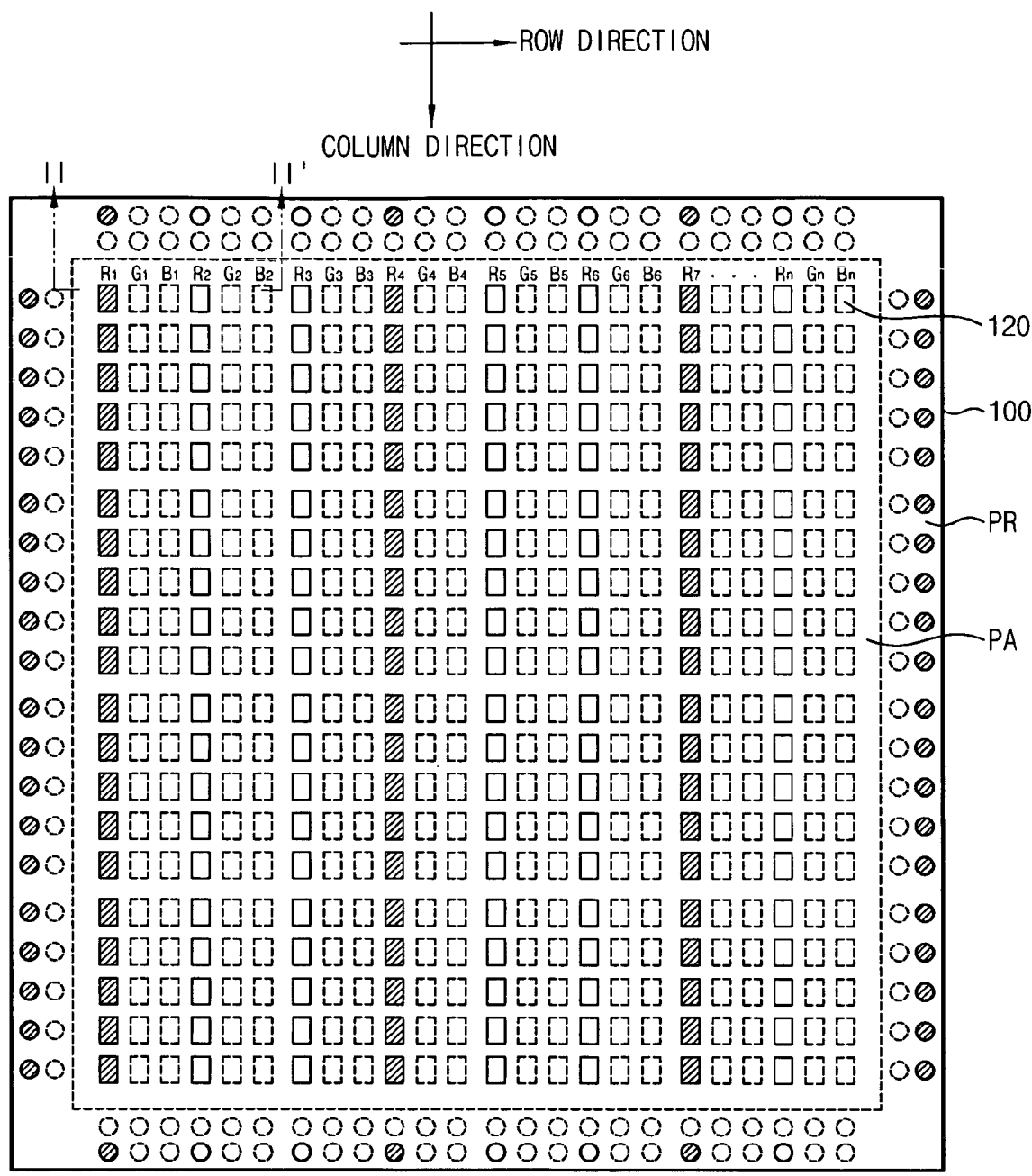
FIG. 6 is a plan view showing first light emitting patterns formed on the base substrate of FIG. 5.
Figure 7:
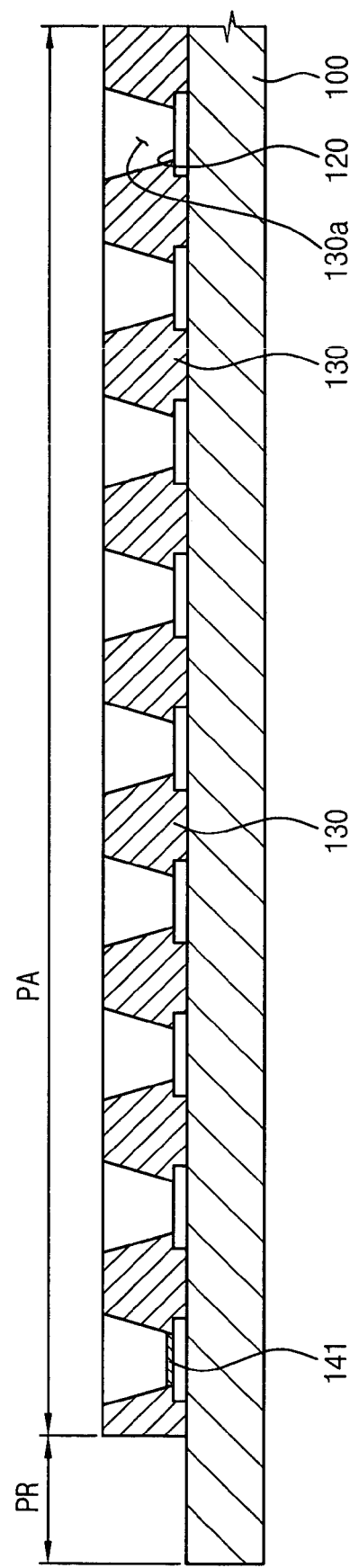
FIG. 7 is a cross-sectional view taken along a line II-II' of FIG. 6.

FIG. 6 is a plan view showing first light emitting patterns formed on the base substrate of FIG. 5. FIG. 7 is a cross-sectional view taken along a line II-II' of FIG. 6.

Referring to FIGS. 2, 6 and 7, the first light emitting patterns 141 are formed on a portion of the first electrodes 120 (step S300). The first light emitting patterns 141 are formed using a light emitting material ejecting device (not shown) having a plurality of nozzles arranged substantially in parallel. Droplets of light emitting material are ejected on the first electrodes 120 through the nozzles.

When size and resolution of the display apparatus increase, the number of the nozzles is smaller than the number of the first electrodes 120 of unit row of the matrix shape. Therefore, the droplets are ejected on the first electrodes 120 through a plurality of scanning processes so that the droplets are ejected on all of the first electrodes 120. Each of the scanning processes includes a plurality of jetting the droplets through the nozzles. That is, each of the scanning processes having the jetting processes is repeated to fill all of the cavities 130a with the droplets. The number of the jetting processes of each of the scanning processes may be the number of the first electrodes 120 of unit column of the matrix shape. Alternatively, the number of the jetting processes of each of the scanning processes may also be a summation of the number of the first electrodes 120 of the unit column and the number of dummy light emitting patterns 144 shown in FIG. 12 corresponding to the unit column.

When a distance between the droplets is small, evaporation rate of volatile materials in the droplets is affected by an adjacent droplet so that the first light emitting patterns 141 may not have uniform thickness. Therefore, the nozzles are spaced apart from one another by a distance of more than an interval between three first electrodes that are adjacent to one another so that the evaporation rate of the volatile materials in the droplets is not affected by the adjacent droplet. That is, the droplets are ejected on once in every at least two first electrodes. In this exemplary embodiment, the droplets are ejected on once in every nine first electrodes. That is, the droplets are ejected on once in every three red pixels.

For example, the light emitting material ejecting device (not shown) has two nozzles, and the droplets are ejected on the first electrodes 120 of the R1 column and the R4 column. The light emitting material ejecting device (not shown) then drops the droplets on the first electrodes 120 of the R7 column and the R10 column. The light emitting material ejecting device (not shown) then drops the droplets on the first electrodes 120 of the R13 column and the R16 column.

The ejecting process is repeated until the droplets are ejected on the first electrodes 120 of the Rn-2 column. That is, the light emitting material ejecting device (not shown) drops the droplets on the first electrodes 120 corresponding to once in every three red pixels so that the first light emitting patterns 141 are formed on the first electrodes 120 corresponding to once in every three red pixels. Therefore, the evaporation rates of the volatile materials in the droplets of the first light emitting patterns 141 are substantially equal to one another so that the first light emitting patterns 141 have uniform profile and thickness. Alternatively, the first light emitting patterns may be formed on the first electrodes 120 corresponding to once in every two to thirty columns. The volatile materials in the droplets of the R1, R4, . . . Rn-2 columns are dried to form the first light emitting patterns 141.

Figure 8:
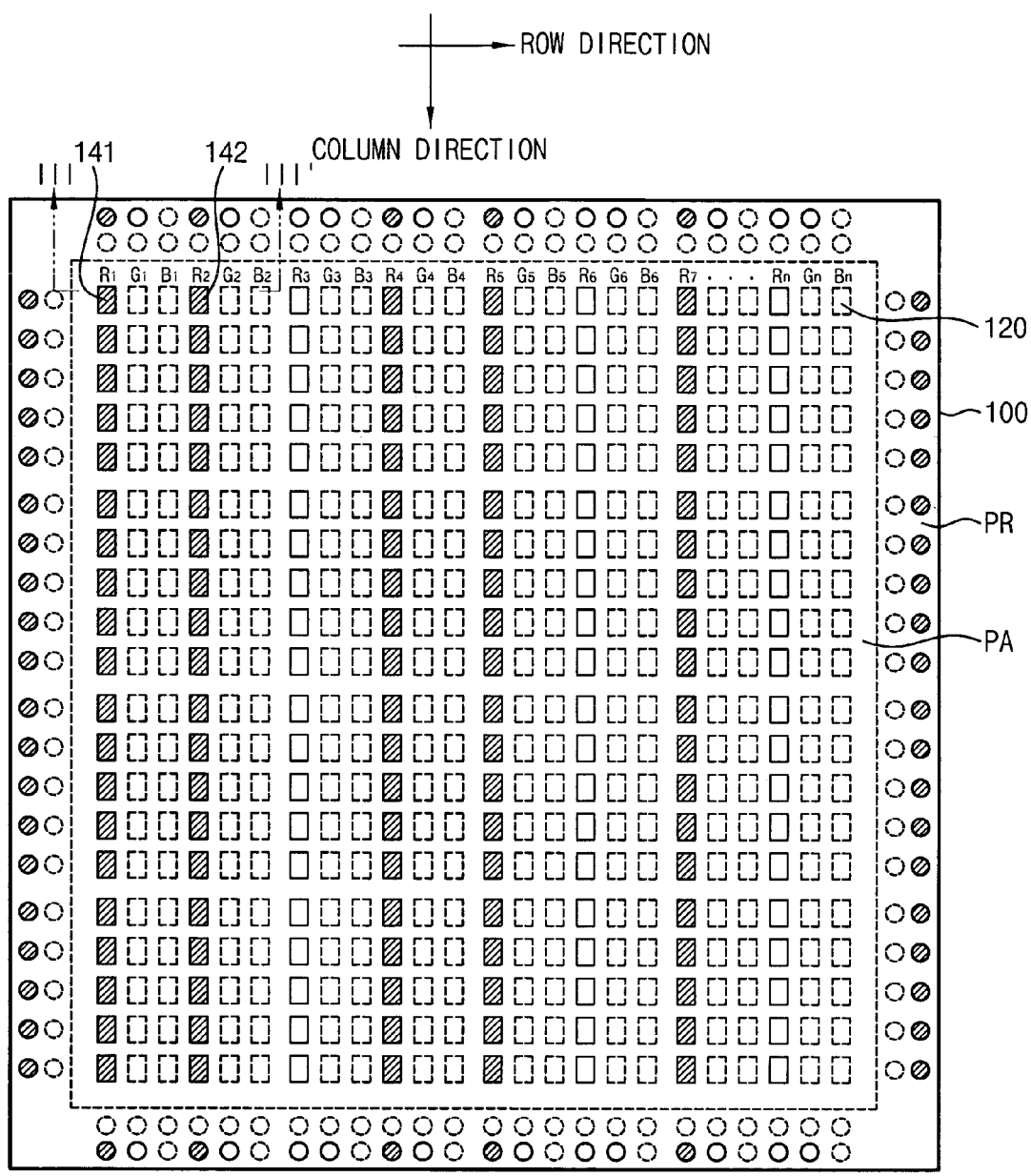
FIG. 8 is a plan view showing second light emitting patterns formed on the base substrate of FIG. 6.
Figure 9:
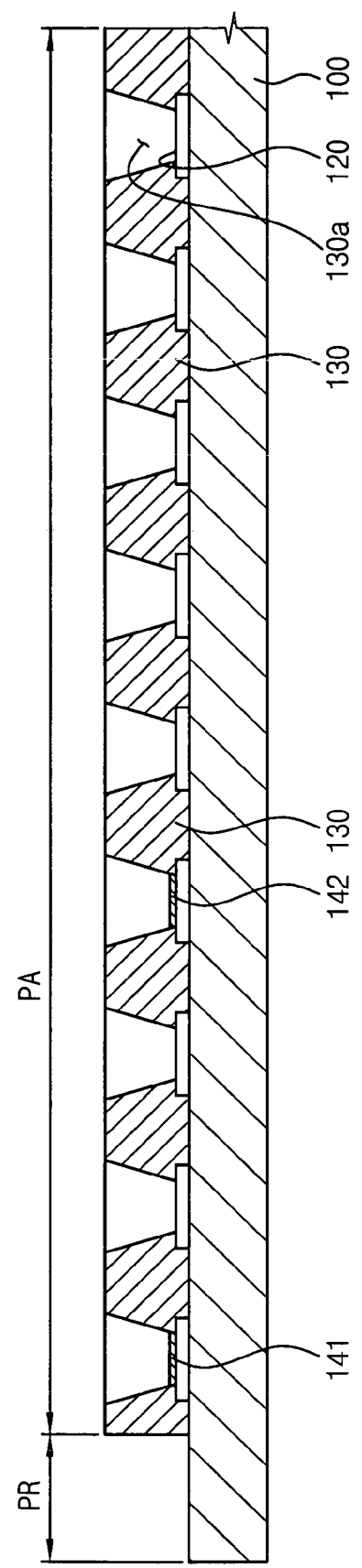
FIG. 9 is a cross-sectional view taken along a line III-III' of FIG. 8.

FIG. 8 is a plan view showing second light emitting patterns formed on the base substrate of FIG. 6. FIG. 9 is a cross-sectional view taken along a line III-III' of FIG. 8.

Referring to FIGS. 2, 8 and 9, the second light emitting patterns 142 are formed on a portion of the first electrodes 120 between the first light emitting patterns (step S400). The second light emitting patterns 142 are formed using the light emitting material ejecting device (not shown) having the nozzles arranged substantially in parallel. The droplets of the light emitting material are ejected on the first electrodes 120 through the nozzles.

In this exemplary embodiment, the droplets are ejected on the first electrodes 120 of the R2 column that is between the R1 and R4 columns, and the R5 column that is between the R4 and R7 columns. The light emitting material ejecting device (not shown) then drops the droplets on the first electrodes 120 of the R8 column and the R11 column. The light emitting material ejecting device (not shown) then drops the droplets on the first electrodes 120 of the R14 column and the R17 column.

The ejecting process is repeated until the droplets are ejected on the first electrodes 120 of the Rn-1 column. That is, the light emitting material ejecting device (not shown) drops the droplets on the first electrodes 120 corresponding to once in every three red pixels so that the second light emitting patterns 142 are formed on the first electrodes 120 corresponding to once in every three red pixels. Therefore, the evaporation rates of the volatile materials in the droplets of the second light emitting patterns 142 are substantially equal to one another so that the second light emitting patterns 142 have uniform profile and thickness. Alternatively, the first light emitting patterns may be formed on the first electrodes 120 corresponding to once in every two to thirty columns. The volatile materials in the droplets of the R2, R5, Rn-1 columns are dried to form the second light emitting patterns 142.

Figure 10:
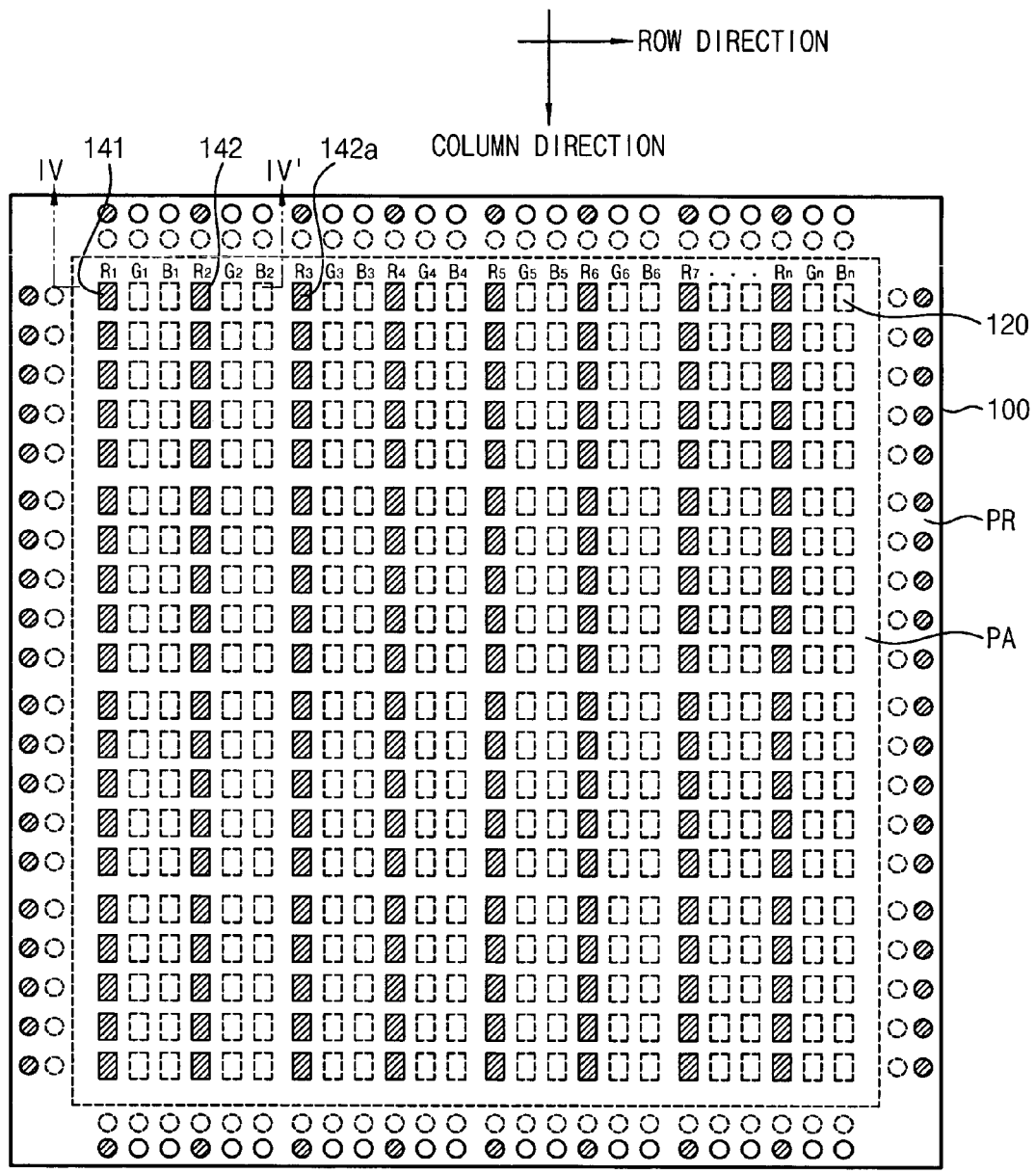
FIG. 10 is a plan view showing third light emitting patterns formed on the base substrate of FIG. 8.
Figure 11:
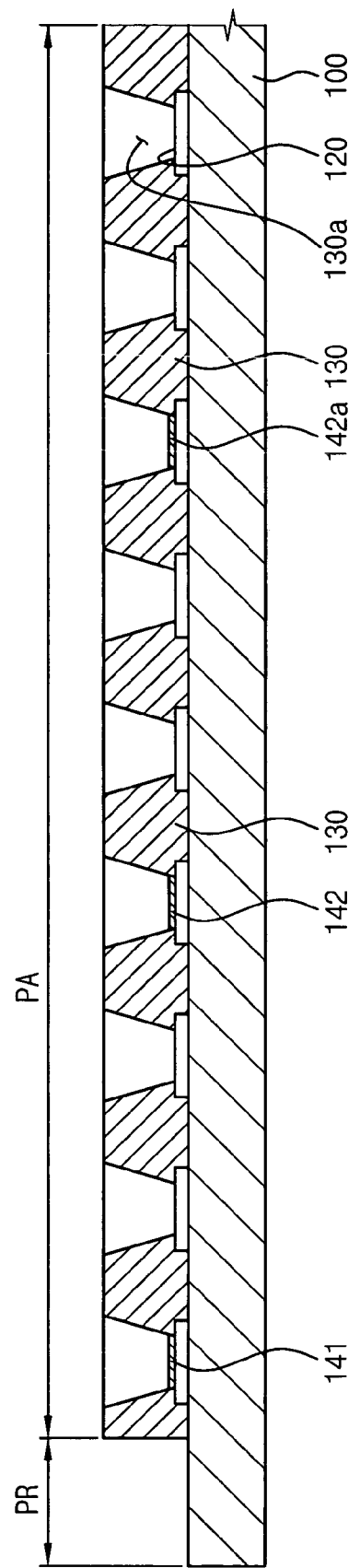
FIG. 11 is a cross-sectional view taken along a line IV-IV' of FIG. 10.

FIG. 10 is a plan view showing third light emitting patterns formed on the base substrate of FIG. 8. FIG. 11 is a cross-sectional view taken along a line IV-IV' of FIG. 10.

Referring to FIGS. 2, 10 and 11, the light emitting material ejecting device (not shown) checks whether the droplets are ejected on all of the first electrodes 120 or not (step S500).

When the droplets are not ejected on all of the first electrodes 120, the third light emitting patterns 142a are formed on a portion of the first electrodes 120 between the first light emitting patterns. The third light emitting patterns 142a are formed using the light emitting material ejecting device (not shown) having the nozzles arranged substantially in parallel. The droplets of the light emitting material are ejected on the first electrodes 120 through the nozzles.

In this exemplary embodiment, the droplets are ejected on the first electrodes 120 of the R3 column that is between the R2 and R4 columns, and the R6 column that is between the R5 and R7 columns. The light emitting material ejecting device (not shown) then drops the droplets on the first electrodes 120 of the R9 column and the R12 column. The light emitting material ejecting device (not shown) then drops the droplets on the first electrodes 120 of the R15 column and the R18 column.

The ejecting process is repeated until the droplets are ejected on the first electrodes 120 of the Rn column. That is, the light emitting material ejecting device (not shown) drops the droplets on the first electrodes 120 corresponding to once in every three red pixels so that the third light emitting patterns 142a are formed on the first electrodes 120 corresponding to once in every three red pixels. Therefore, the evaporation rates of the volatile materials in the droplets of the third light emitting patterns 142a are substantially equal to one another so that the third light emitting patterns 142a have uniform profile and thickness. The volatile materials in the droplets of the R3, R6, . . . Rn columns are dried to form the third light emitting patterns 142a.

Positive charge carrier injection patterns (not shown) may be formed between the first electrodes 120 and the first to third light emitting patterns 141, 142 and 142a. The positive charge carrier injection patterns (not shown) are formed through the same method as the first to third light emitting patterns 141, 142 and 142a.

Figure 12:
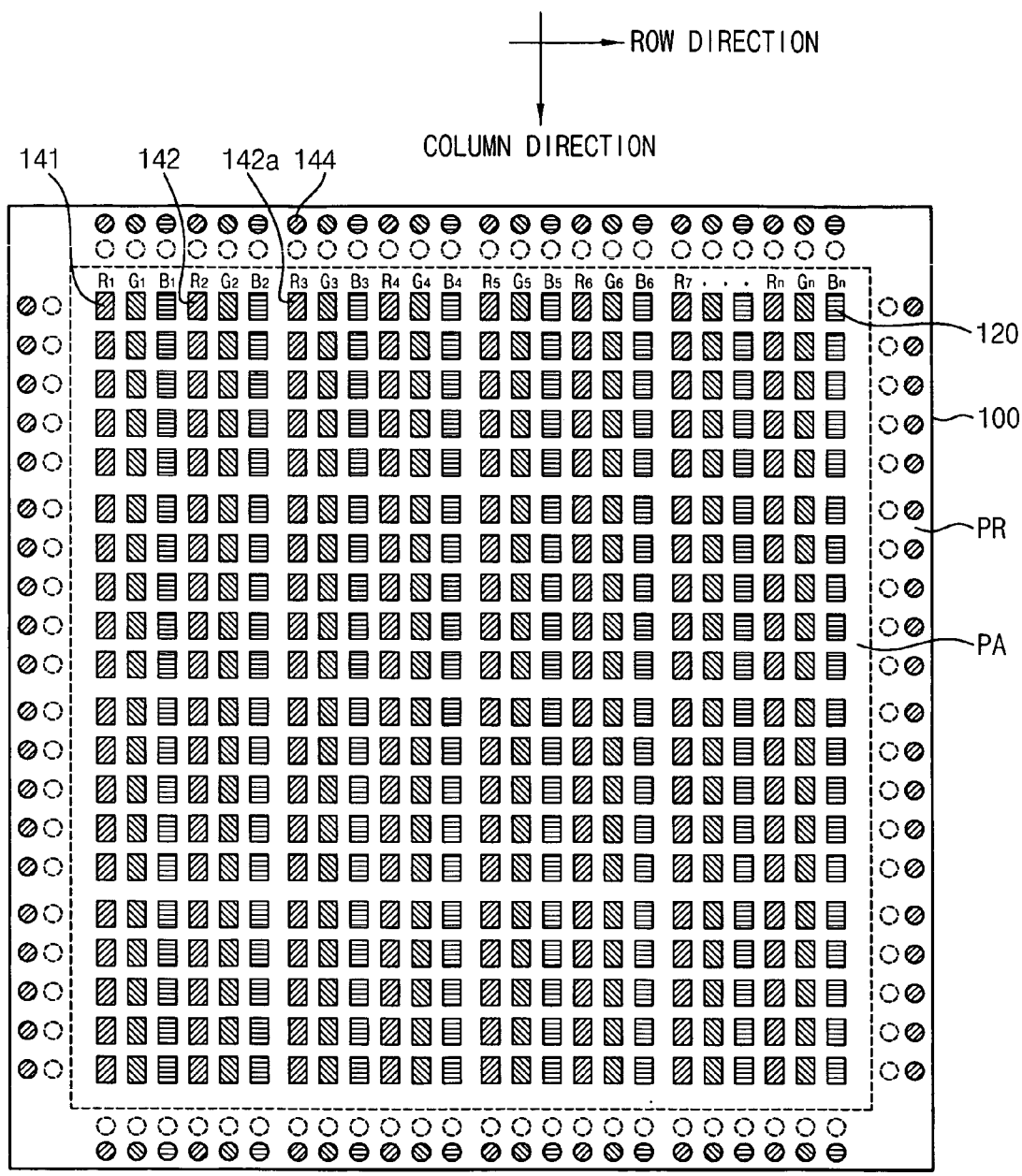
FIG. 12 is a plan view showing green light emitting patterns and blue light emitting patterns formed on the base substrate of FIG. 10.

FIG. 12 is a plan view showing green light emitting patterns and blue light emitting patterns formed on the base substrate of FIG. 10.

Referring to FIG. 12, the light emitting patterns that corresponds to the R1, G1, B1, R2, G2, B2, . . . Rn, Gn and Bn columns have the red light emitting patterns 141, 142 and 142a that each corresponds to the R1, R2, . . . Rn columns, the green light emitting patterns that each corresponds to the G1, G2, . . . Gn columns and the blue light emitting patterns that each corresponds to the B1, B2, . . . Bn columns.

After the red light emitting patterns 141, 142 and 142a are completed, the green light emitting patterns and the blue light emitting patterns are formed through the same method as the red light emitting patterns 141, 142 and 142a.

The green light emitting patterns or the blue light emitting patterns may be formed on the first electrodes 120 corresponding to once in every two to thirty columns. Prior to forming the light emitting patterns, the positive charge carrier injection patterns (not shown) may be formed between the first electrodes 120 and the light emitting patterns through the same method as the light emitting patterns.

In this exemplary embodiment, prior to forming the light emitting patterns, dummy light emitting patterns 144 are formed in the peripheral region PR so that the evaporation rate of the light emitting patterns adjacent to an interface between the pixel area PA and the peripheral region PR becomes substantially equal to one another to uniformize the thickness of the light emitting patterns.

Figure 13:
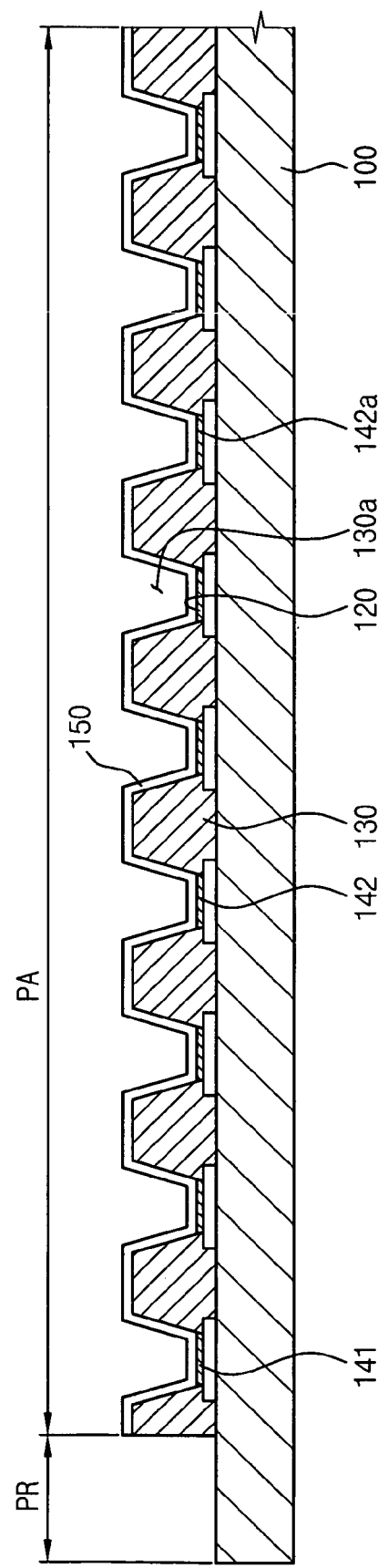
FIG. 13 is a cross-sectional view showing a second electrode formed on the base substrate of FIG. 12.

FIG. 13 is a cross-sectional view showing a second electrode formed on the base substrate of FIG. 12.

Referring to FIGS. 2 and 13, a conductive material is deposited on the base substrate 100 including the red light emitting patterns that has the first to third light emitting patterns 141, 142 and 142a, the green light emitting patterns and the blue light emitting patterns to form a second electrode 150. The second electrode 150 comprises an alkaline metal such as lithium (Li), sodium (Na), etc., an alkaline earth metal such as magnesium (Mg), calcium (Ca), barium (Ba), etc. The second electrode 150 may have a double-layered structure of the metal layer and a capping layer formed on the metal layer. The second electrode 150 may be formed through the sputtering method, the CVD method, etc.

In this exemplary embodiment, the first to third light emitting patterns 141, 142 and 142a are formed on the first electrodes 120 of the R1, R4, . . . Rn-2 columns, the R2, R5, . . . Rn-1 columns and the R3, R6, . . . Rn columns, respectively. Alternatively, the light emitting patterns may be grouped based on each of the columns R1, R2, . . . Rn. For example, the first electrodes of the R1, R4 and R2 columns may be the first to third light emitting patterns, respectively. For example when n is 9, the first electrodes of the R1, R4, R7, R2, R5, R8, R3, R6 and R9 columns are the first to ninth light emitting patterns, respectively. In addition, the light emitting patterns of the R1, R2, . . . Rn columns may be formed in a random order.

In this exemplary embodiment, the light emitting patterns are formed through the scanning processes in the column direction. Alternatively, the light emitting patterns may be formed through the scanning processes in the row direction.

According to the present invention, scanning order of droplets of light emitting material is controlled so that evaporation rates of the droplets are not affected by adjacent droplets. Therefore, thicknesses of light emitting patterns formed by the droplets are uniformized so that luminance of a display apparatus is improved, and also uniformized.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A method of manufacturing a light emitting element comprising:
    forming a plurality of first electrodes arranged in a matrix shape on a pixel area of a base substrate;
    forming a bank between the first electrodes;
    ejecting a light emitting material on a portion of the first electrodes spaced apart from one another to form a plurality of first light emitting patterns;
    ejecting the light emitting material on a portion of the first electrodes between the first light emitting patterns to form a plurality of second light emitting patterns; and
    forming a second electrode on the first and second light emitting patterns;
    wherein the method of manufacturing the light emitting element further comprises:
    ejecting a green light emitting material on a portion of the first electrodes spaced apart from one another to form a plurality of first green light emitting patterns;
    ejecting the green light emitting material on a portion of the first electrodes between the first green light emitting patterns to form a plurality of second green light emitting patterns;
    ejecting a blue light emitting material on a portion of the first electrodes spaced apart from one another to form a plurality of first blue light emitting patterns; and
    ejecting the blue light emitting material on a portion of the first electrodes between the first blue light emitting patterns to form a plurality of second blue light emitting patterns, and wherein the light emitting material is a red light emitting material, and the first and second light emitting patterns are first red light emitting patterns and second red light emitting patterns, respectively.

2. The method of claim 1, further comprising ejecting the light emitting material on a portion of the first electrodes between the first and second light emitting patterns to form a plurality of third light emitting patterns.

3. The method of claim 1, wherein the first and second light emitting patterns are arranged in a random order.

4. The method of claim 1, wherein the light emitting material comprises an organic light emitting material and a volatile material, and an evaporation rate of the volatile material of the first light emitting patterns is substantially equal to an evaporation rate of the volatile material of the second light emitting patterns.

5. A method of manufacturing a light emitting element comprising:
    forming a plurality of first electrodes arranged in a matrix shape on a pixel area of a base substrate;
    forming a bank between the first electrodes;
    ejecting a light emitting material on a portion of the first electrodes spaced apart from one another to form a plurality of first light emitting patterns;
    ejecting the light emitting material on a portion of the first electrodes between the first light emitting patterns to form a plurality of second light emitting patterns;
    ejecting the light emitting material on a portion of the first electrodes between the first and second light emitting patterns to form a plurality of third light emitting patterns; and
    forming a second electrode on the first to third light emitting patterns,
    wherein the method of manufacturing the light emitting element further comprises:
    ejecting a green light emitting material on a portion of the first electrodes spaced apart from one another to form a plurality of first green light emitting patterns;
    ejecting the green light emitting material on a portion of the first electrodes between the first green light emitting patterns to form a plurality of second green light emitting patterns;
    ejecting the green light emitting material on a portion of the first electrodes between the first and second green light emitting patterns to form a plurality of third green light emitting patterns;
    ejecting a blue light emitting material on a portion of the first electrodes spaced apart from one another to form a plurality of first blue light emitting patterns;
    ejecting the blue light emitting material on a portion of the first electrodes between the first blue light emitting patterns to form a plurality of second blue light emitting patterns; and
    ejecting the blue light emitting material on a portion of the first electrodes between the first and second blue light emitting patterns to form a plurality of third blue light emitting patterns, and wherein the light emitting material is a red light emitting material, and the first to third light emitting patterns are first red light emitting patterns, second red light emitting patterns and third red light emitting patterns, respectively.

6. The method of claim 5, wherein the first to third light emitting patterns are arranged in a column direction of the matrix shape.

7. The method of claim 6, wherein the first light emitting patterns are formed on once in every two to thirty of the first electrodes.

8. The method of claim 5, wherein the first and second light emitting patterns are spaced apart from one another by a uniform distance.

9. The method of claim 5, wherein forming of the first to third light emitting patterns is repeated until the first to third light emitting patterns are formed on all of the first electrodes.

10. The method of claim 9, wherein the first to third light emitting patterns are arranged in a random order.

11. A method of manufacturing a display apparatus comprising:
    forming a plurality of switching devices on a pixel area of a base substrate;
    forming a plurality of driver devices on the pixel area of the base substrate, a gate electrode of each of the driver devices being electrically connected to a source/drain electrode of each of the switching devices;
    forming a plurality of first electrodes arranged in a matrix shape on the pixel area of the base substrate;
    forming a bank between the first electrodes;
    ejecting a light emitting material on a portion of the first electrodes spaced apart from one another to form a plurality of first light emitting patterns;
    ejecting the light emitting material on a portion of the first electrodes between the first light emitting patterns to form a plurality of second light emitting patterns; and
    forming a second electrode on the first and second light emitting patterns,
    wherein the method of manufacturing the display apparatus further comprises:
    ejecting a green light emitting material on a portion of the first electrodes spaced apart from one another to form a plurality of first green light emitting patterns;
    ejecting the green light emitting material on a portion of the first electrodes between the first green light emitting patterns to form a plurality of second green light emitting patterns;
    ejecting a blue light emitting material on a portion of the first electrodes spaced apart from one another to form a plurality of first blue light emitting patterns; and
    ejecting the blue light emitting material on a portion of the first electrodes between the first blue light emitting patterns to form a plurality of second blue light emitting patterns, and wherein the light emitting material is a red light emitting material, and the first and second light emitting patterns are first red light emitting patterns and second red light emitting patterns, respectively.

12. The method of claim 11, wherein the forming of the first and second light emitting patterns is repeated, until the first and second light emitting patterns are formed on all of the first electrodes.

13. The method of claim 12, wherein the first and second light emitting patterns are arranged in a random order.

* * * * *